US012587010B2

(12) United States Patent
Liu et al.

(10) Patent No.: US 12,587,010 B2
(45) Date of Patent: Mar. 24, 2026

(54) METHOD FOR ADJUSTING GATE BIAS CLAMP VOLTAGE, SEMICONDUCTOR DEVICE, AND BIAS CLAMP CIRCUIT USING THE SAME

(71) Applicant: TAIWAN SEMICONDUCTOR MANUFACTURING COMPANY LTD., Hsinchu (TW)

(72) Inventors: Chien Hung Liu, Hsinchu County (TW); Hsin Fu Lin, Hsinchu County (TW); Kuo-Ching Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 130 days.

(21) Appl. No.: 18/433,438

(22) Filed: Feb. 6, 2024

(65) Prior Publication Data

US 2025/0253650 A1      Aug. 7, 2025

(51) Int. Cl.
| | |
|---|---|
| *H02H 9/04* | (2006.01) |
| *H02H 1/00* | (2006.01) |
| *H10D 30/65* | (2025.01) |
| *H10D 89/60* | (2025.01) |

(52) U.S. Cl.
CPC .......... *H02H 9/046* (2013.01); *H02H 1/0007* (2013.01); *H10D 30/65* (2025.01); *H10D 89/611* (2025.01)

(58) Field of Classification Search
CPC ...... H02H 9/046; H02H 1/0007; H10D 30/65; H10D 89/611

USPC .......................................................... 361/56
See application file for complete search history.

(56) References Cited

U.S. PATENT DOCUMENTS

| | | | | |
|---|---|---|---|---|
| 6,229,180 B1 * | 5/2001 | Yoshida | ............... | H10D 89/611 |
| | | | | 257/E25.015 |
| 8,014,118 B2 * | 9/2011 | Ikegami | ................. | G09G 3/296 |
| | | | | 361/111 |
| 8,243,405 B2 * | 8/2012 | Hemon | ............ | H03K 17/08142 |
| | | | | 361/111 |
| 8,310,796 B2 * | 11/2012 | Wagoner | ................. | H03F 1/302 |
| | | | | 361/103 |
| 8,767,369 B2 * | 7/2014 | Kuttenkuler | ..... | H03K 17/08128 |
| | | | | 361/111 |
| 8,854,103 B2 * | 10/2014 | Willemen | ........ | H03K 17/08122 |
| | | | | 327/330 |

(Continued)

FOREIGN PATENT DOCUMENTS

| | | | | |
|---|---|---|---|---|
| EP | 1041634 A1 * | 10/2000 | ........... | H10D 86/201 |
| EP | 2256806 A2 * | 12/2010 | ........... | H10D 12/411 |
| EP | 3716434 A1 * | 9/2020 | ........... | H03K 17/102 |

OTHER PUBLICATIONS

Williams, Richard; Title: Power Mosfet having voltage-clamped gate; EP 1041634; (Year: 2000).*

*Primary Examiner* — Dharti H Patel
(74) *Attorney, Agent, or Firm* — WPAT LAW; Anthony King

(57) ABSTRACT

The present disclosure provides a bias clamp circuit, which includes a plurality of switchable clamp voltage paths, configured to selectively clamp a gate bias voltage of a vulnerable circuit to a first voltage or a second voltage based on whether a reliability acceleration test is performed on the vulnerable circuit or not. The second voltage is higher than the first voltage.

20 Claims, 8 Drawing Sheets

(56)  References Cited

U.S. PATENT DOCUMENTS

| | | | | | |
|---|---|---|---|---|---|
| 10,381,828 | B1 * | 8/2019 | Knoedgen | ............ | H10D 89/911 |
| 11,695,272 | B1 * | 7/2023 | Fang | .................... | H10D 89/811 |
| | | | | | 361/118 |
| 12,381,387 | B1 * | 8/2025 | Leung | .................. | H03K 17/063 |
| 2008/0007883 | A1 * | 1/2008 | Arndt | .................. | H03K 17/145 |
| | | | | | 361/91.1 |
| 2008/0192390 | A1 * | 8/2008 | Yoshida | ............ | G01R 31/2879 |
| | | | | | 361/18 |
| 2010/0271738 | A1 * | 10/2010 | Tsai | ....................... | H02H 9/046 |
| | | | | | 361/56 |
| 2011/0013328 | A1 * | 1/2011 | Duryea | ............. | H03K 17/0822 |
| | | | | | 361/93.9 |
| 2011/0255201 | A1 * | 10/2011 | Shimomura | ........... | H02H 9/046 |
| | | | | | 361/56 |
| 2012/0026632 | A1 * | 2/2012 | Acharya | ............. | H03K 17/081 |
| | | | | | 361/56 |
| 2012/0236456 | A1 * | 9/2012 | Yu | .......................... | H05B 47/25 |
| | | | | | 361/91.1 |
| 2015/0036247 | A1 * | 2/2015 | Hsia | ......................... | H04B 3/02 |
| | | | | | 361/56 |
| 2015/0098163 | A1 * | 4/2015 | Ferrara | ............... | H03K 17/145 |
| | | | | | 327/309 |
| 2016/0105015 | A1 * | 4/2016 | Wang | .................... | H02H 3/162 |
| | | | | | 361/42 |
| 2018/0026440 | A1 * | 1/2018 | Zhao | .................... | H10D 89/819 |
| | | | | | 361/56 |
| 2024/0178830 | A1 * | 5/2024 | Leong | ................. | H10D 89/611 |
| 2025/0253650 | A1 * | 8/2025 | Liu | ...................... | H02H 1/0007 |

* cited by examiner

--Prior Art--

METHOD FOR ADJUSTING GATE BIAS CLAMP VOLTAGE, SEMICONDUCTOR DEVICE, AND BIAS CLAMP CIRCUIT USING THE SAME

BACKGROUND

The present disclosure relates to electronic circuits, and, in particular, to a method for adjusting gate bias clamp voltage, a semiconductor device, and a bias clamp circuit using the same.

An integrated circuit (IC) typically includes internal circuitry and input/output (I/O) devices, with the I/O devices being connected to the power-supply I/O pads of the IC. These I/O pads are subject to higher power supply voltages than logic devices within the internal circuitry. To protect the I/O devices, bias clamps may be used in ICs.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1:
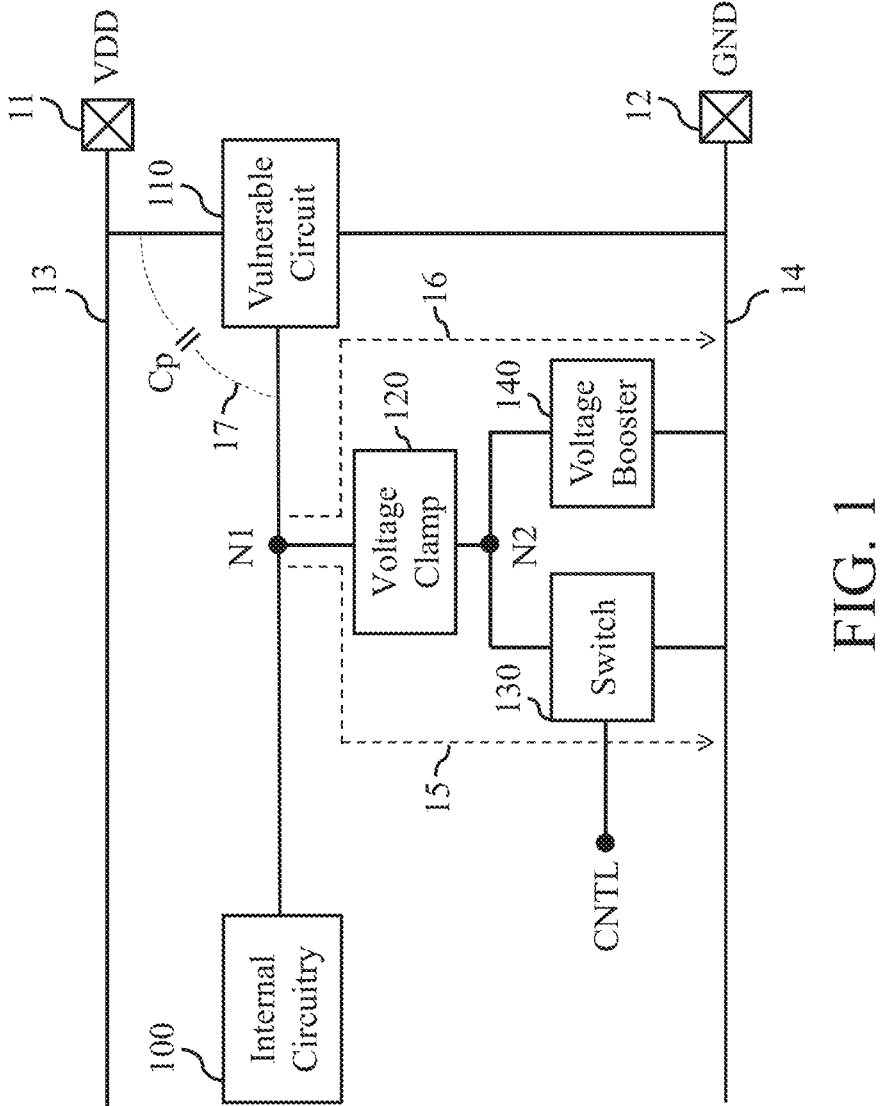
FIG. 1 is a block diagram of a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Reliability test on ICs may be accelerated by using higher voltages. Hence, it would be advantageous to provide clamping circuits or mechanisms with the ability and/or flexibility to provide different amounts of clamping voltages.

FIG. 1 is a block diagram of a semiconductor device in accordance with an embodiment of the present disclosure.

In some embodiments, the semiconductor device 10 may be a CMOS (complementary metal oxide semiconductor) integrated circuit (IC) which includes internal circuitry 100, a vulnerable circuit 110, a voltage clamp 120, a switch 130, a voltage booster 140, and a capacitor C1, as depicted in FIG. 1. The internal circuitry 100 may include logic circuitry within the semiconductor device 10. The vulnerable circuit 110 could be a power device with a terminal coupled to node N1 (such as a control terminal), a first terminal coupled to power rail 13, and a second terminal coupled to power rail 14. Power rails 13 and 14 are electrically connected to the input/output (I/O) pads (or I/O terminals) 11 and 12 of the semiconductor device 10, respectively. In some embodiments, the I/O pad 12 and power rail 14 can be referred to as a reference node. During a normal direct-current (DC) operation mode, the I/O pads 11 and 12 may be connected to a power supply voltage VDD and a reference voltage (such as the ground voltage (GND)), respectively. In an electrostatic discharge (ESD) mode, the I/O pads 11 and 12 may be floating, and an ESD event can occur on the I/O pad 11 and/or 12. In some embodiments, the vulnerable circuit 110 may be an I/O circuit that can be implemented using a power laterally-diffused metal oxide semiconductor (LD-MOS) transistor or a power CMOS transistor with a large channel width fabricated in a CMOS manufacturing process, but the present disclosure is not limited thereto.

LDMOS transistors may be used in the I/O circuitry due to their ability to withstand higher voltages compared to typical MOS devices (e.g., core devices and/or logic devices) used in the internal circuitry 100, such as logic circuitry. In the context of this disclosure, the main difference between the I/O circuitry and internal circuitry 100 is that the I/O circuitry is vulnerable to exposure to an external environment of the fabricated chip (e.g., being connected to a (I/O) pad), and therefore the I/O circuitry may be subject to harsh external conditions, such as sudden voltage surges (often caused by ESD events). The internal circuitry 100 (e.g., including logic devices) is usually located within well-regulated power domains (such as a power supply voltage of 1.8V) and therefore, the logic devices in the internal circuitry 100 may generally not be required to handle sudden voltage surges.

The voltage clamp 120 may be a fixed-voltage clamp coupled between nodes N1 and N2. In some embodiments, the voltage clamp 120 can be implemented using a Zener diode with a particular breakdown voltage (BV), but the present disclosure is not limited thereto. The switch 130, coupled between node N2 and power rail 14, may be implemented using a depletion (e.g., N-type) transistor or an enhancement (e.g., N-type) transistor. The switch 130 may be controlled by a control signal CNTL which may originate from the internal circuitry 100 or an external control signal, but the disclosure is not limited thereto. In some embodiments, the voltage clamp 120 and the switch 130 may form a first clamp voltage path 15, which provides a first clamp voltage to node N1 (e.g., a terminal of the vulnerable circuit 110, which may be a gate terminal thereof). In some embodiments, given that the switch 130 is implemented using a depletion N-type transistor which has a negative threshold voltage, when the control signal CNTL with a ground voltage (e.g., 0V) is provided to the gate of the depletion N-type transistor (e.g., the control terminal of the switch 130), the depletion N-type transistor is turned on. Additionally, when the control signal CNTL with a negative voltage lower than the threshold voltage of the depletion N-type transistor is provided to the gate of the depletion N-type transistor (e.g., the control terminal of the switch 130), the depletion N-type transistor is turned off. The ability to turn on the switch 130 with a ground voltage may help save power and/or ease the design of related (logic) circuitry.

The coupling path 17 is a result of the parasitic capacitance Cp of the vulnerable circuit 110 (e.g., an LDMOS or MOS transistor) and may therefore be unavoidable. As the coupling path 17 may be exposed to external environment that is not easily regulated by circuitry of the semiconductor device 10, unforeseen amounts of voltages and/or currents may couple through the coupling path 17. To address some unforeseen events (such as ESD events), the gate of the LDMOS or MOS transistor may be coupled to the voltage clamp 120 to limit the gate voltage to a first voltage (e.g., a first clamp voltage path) or a second voltage (e.g., a second clamp voltage path) that is below the threshold for protecting the gate oxide of the LDMOS or MOS transistor from being damaged.

The voltage booster 140 may be configured to provide a boost voltage in conjunction with the fixed clamp voltage provided by the voltage clamp 120. In some embodiments, the voltage booster 140 and the voltage clamp 120 may form a second clamp voltage path 16 which provides a second voltage to node N1 (e.g., (gate) terminal of the vulnerable circuit 110). The second voltage may be higher than the first voltage.

Figure 2:
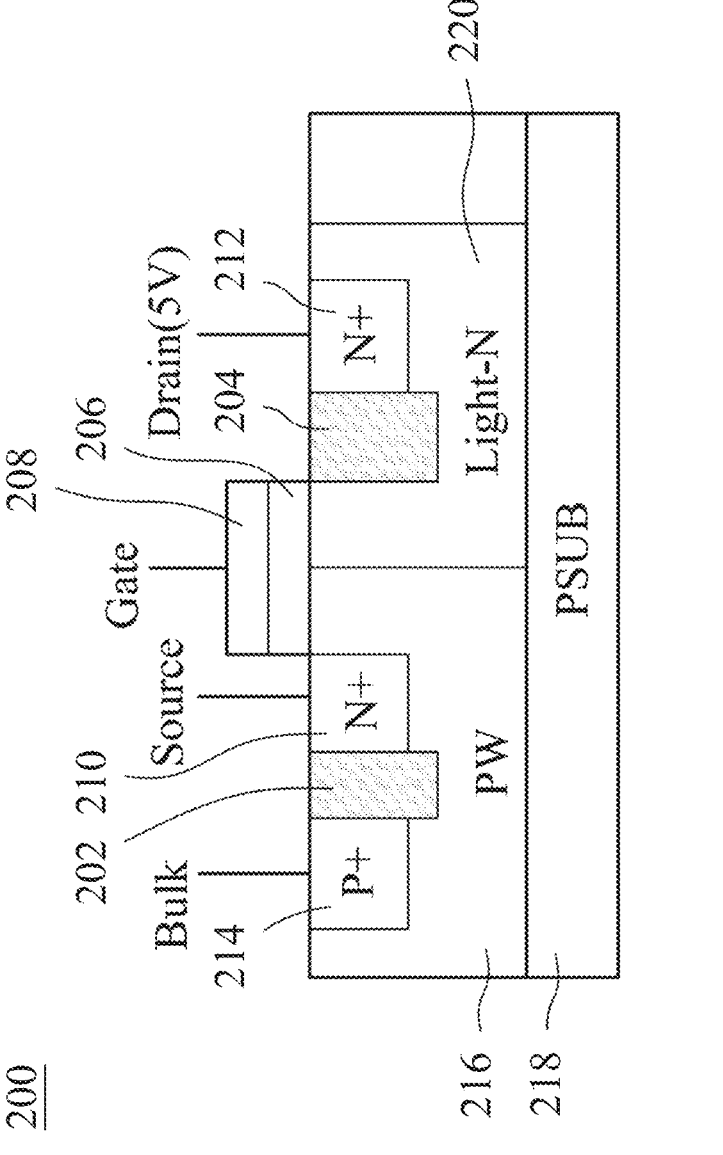
FIG. 2 is a cross section of a transistor in accordance with an embodiment of the present disclosure.

FIG. 2 is a cross section of a transistor in accordance with an embodiment of the present disclosure.

While some CMOS transistors (e.g., core devices) in the internal circuitry 100 shown in FIG. 1 may be designed for lower voltage applications (e.g., 1.2V or 1.8V), the transistor 200 shown in FIG. 2 may be designed for higher voltage applications (e.g., 5V). The transistor 200 may be fabricated using a laterally diffused MOS (LDMOS) technology in a CMOS manufacturing process, and it can be regarded as an LDMOS transistor.

For example, a well region 216 and a well region 220 may be formed on the substrate 218, and the well region 216 and the well region 220 may be next to each other. The well region 216 may be a P-type well region, and the well region 220 may be a lightly doped N-type region. The well region 220 may function as a drift region for the n-channel LDMOS device. In some embodiments, the well region 220 may be part of the substrate 218 and form by implantation in absence of an epitaxial layer. The well region 220 may have an N-type dopant such as phosphorus. In some embodiments, the well region 220 may be formed by a plurality of processing steps, whether known or to be developed, such as growing a sacrificial oxide over substrate, opening a pattern for the location of the N-well region, and implanting the impurities.

The transistor 200 may include various isolation structures such as shallow trench isolation (STI) or local oxidation of silicon (LOCOS) formed on the well region 216 or substrate 218 to define and electrically isolate various active regions. As depicted in FIG. 2, the transistor 200 may include STI region 202 and 204. For example, the STI regions 202 and 204 may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and nitride stripping to remove the silicon nitride.

The doped regions 214 and 210 may be fabricated within the well region 216, and separated by the STI region 202. The doped regions 214 and 210 may be electrically connected to the bulk terminal and the source terminal, respectively. In some embodiments, the doped region 214 may be a highly doped P-type region with P-type impurities (e.g., P+), such as boron. The doped region 210 may be a highly doped N-type region with N-type impurities (e.g., N+), such as phosphorous or arsenic for an n-channel LDMOS device. The STI region 202, and the doped regions 214 and 210 may be surrounded by the well region 216.

The doped region 212 may be fabricated within the well region 220, and a STI region 204 may be fabricated next to the doped region 212 to separate the doped region 212 from the channel (i.e., P-type channel between the doped region 210 and the STI region 204). The doped region 212 and the STI region may be surrounded by the well region 220. In some embodiments, the doped region 212 may be a highly doped N-type region and electrically connected to the drain terminal. The gate oxide 206 may be formed on top of the boundary between the well region 216 and the well region 220, as shown in FIG. 2. The polysilicon 208 may be formed on the gate oxide 206 and electrically connected to the gate.

Since the transistor 200 is implemented using the LDMOS technique with STI regions (e.g., the STI region 204 next to the doped region 212), the symbol of the transistor 200 may be illustrated with the STI region, as shown by the LDMOS transistor Q1 in FIGS. 3 to 7.

It should be noted that the voltage difference |VDG| between the drain terminal and the gate of the transistor 200 can be limited within 5V (i.e., |VDG|≤5V), and the voltage difference |VDS| between the drain terminal and the source terminal of the transistor 200 can also be limited within 5V (i.e., |VDS|≤5V). In some embodiments, due to reliability concerns, the gate oxide 206 may be fabricated with a voltage tolerance of 10% for 5V applications, and the voltage difference between the gate and the source terminal of the transistor 200 may be limited within 5.5V.

In some embodiments, the gate oxide of the MOS devices within the internal circuitry 100 shown in FIG. 1 is designed for 1.8V applications, while the gate oxide of the transistor 200 (e.g., the vulnerable circuit 110) may be designed for 5V applications. Accordingly, the gate oxides of the MOS devices in the internal circuitry 100 and the transistor 200 may be formed in separate stages of the CMOS manufacturing process. For example, the gate oxides of the MOS devices in the internal circuitry 100 may be formed prior to the formation of the gate oxide of the transistor 200.

Figure 3:
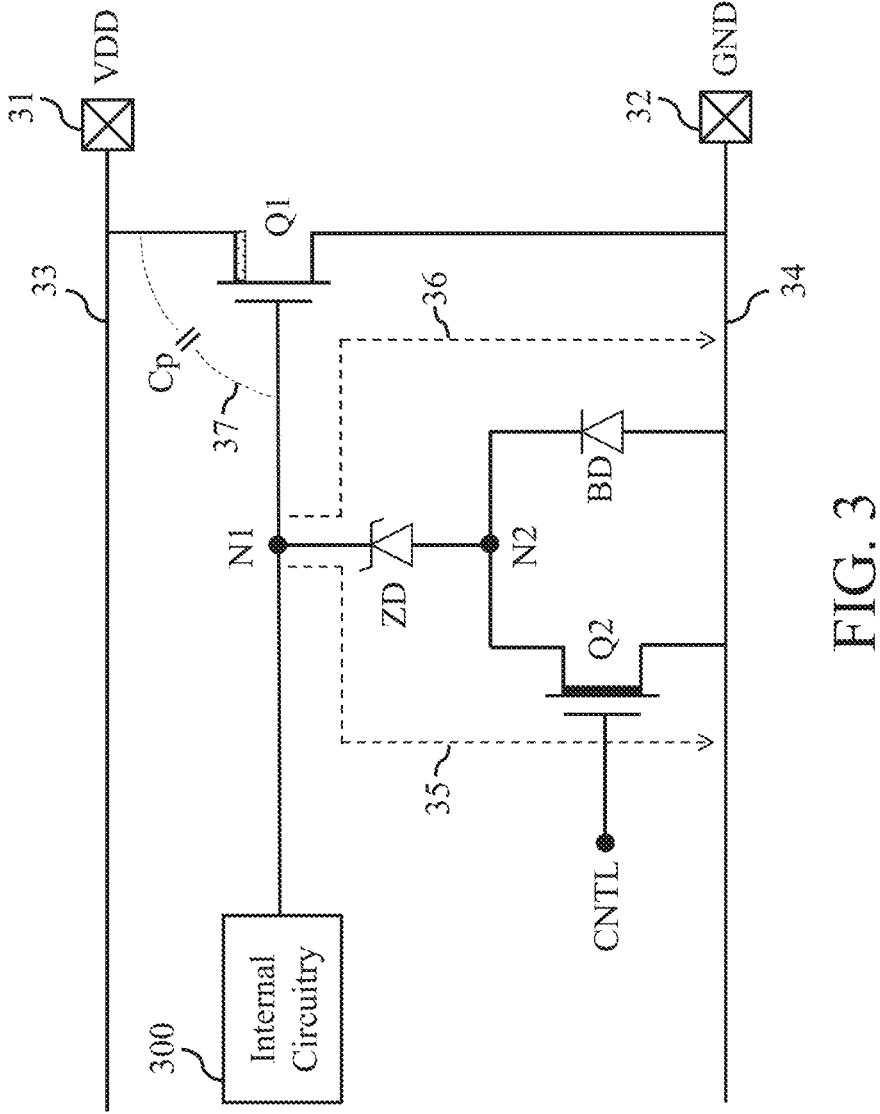
FIG. 3 is a schematic diagram of a semiconductor device in accordance with an embodiment of the present disclosure.

FIG. 3 is a schematic diagram of a semiconductor device in accordance with an embodiment of the present disclosure. Please refer to FIG. 1 and FIG. 3.

The semiconductor device 10 shown in FIG. 1 may be implemented using the semiconductor device 30 shown in FIG. 3. In some embodiments, as depicted in FIG. 3, the vulnerable circuit 110 shown in FIG. 1 may be implemented using an LDMOS transistor Q1, and the voltage clamp 120 may be implemented using a Zener diode ZD. In addition, the switch 130 may be implemented using transistor Q2 which is a depletion N-type transistor, and the voltage booster 140 may be implemented using a reverse-biased boost diode BD with an anode connected to power rail 34 and a cathode connected to node N2.

In some embodiments, the gate oxide of the LDMOS transistor Q1 is susceptible to degradation over time, leading to an increase in leak current and potential failure of the LDMOS transistor Q1. Power devices like the LDMOS transistor Q1 usually have certain lifetime requirements, such as a minimum of 10 years under defined operating conditions, including 5V and 85° C. To ensure these devices meet their lifetime requirements, they have to undergo rigorous lifetime testing, also known as reliability testing. However, it is impractical to conduct these tests by operating the devices under the specified conditions for the entire duration of their expected lifetime, which can be 10 years or longer.

To accelerate lifetime/reliability testing, the devices-under-test (e.g., LDMOS transistor Q1) may be operated under more stringent conditions than the specified normal operating conditions. For example, during the reliability acceleration test of the semiconductor device 30, the I/O pad 31 may be supplied with a high power supply voltage VDD of approximately 7.5V, and the gate voltage of the LDMOS transistor Q1 provided by the internal circuitry 300 may also be at a higher voltage, such as 7.5V, rather than the lower voltage, such as 5.5V, used during the normal DC operation mode of the semiconductor device 30. The higher voltage represents a harsher-than-normal environment that accelerates the aging of the devices-under-test (e.g., LDMOS transistor Q1), thereby reducing the testing time.

In some embodiments, since transistor Q2 is a depletion N-type transistor with a negative threshold voltage, the control signal CNTL may be the ground voltage (e.g., 0V) during the normal DC operation mode of the semiconductor device 30 or floating during an ESD mode of the semiconductor device 30, causing transistor Q2 to turn on. Additionally, during the reliability acceleration test of the semiconductor device 30, the control signal CNTL may be a negative voltage lower than the threshold voltage of the transistor Q2 (e.g., a depletion N-type transistor) to turn off transistor Q2.

In some embodiments, during the normal DC operation mode of the semiconductor device 30, the coupling path 37 can be neglected (e.g., open circuited), and the LDMOS transistor Q1 may be designed to operate at a power supply voltage of 5V, with the gate voltage at node N1 not expected to exceed 5.5V in order to protect the gate oxide of the LDMOS transistor Q1. In this scenario, a Zener diode ZD with a breakdown voltage of 5.5V can be employed. If the gate voltage at node N1 eventually exceeds the breakdown voltage of the Zener diode ZD during the normal DC operation mode, the Zener diode ZD would enter the breakdown region, allowing a large current to pass through while maintaining its gate voltage at the breakdown voltage of the Zener diode ZD (e.g., 5.5V). Thus, the large current will flow from node N1 to the ground (e.g., power rail 34) along a current discharge path 35 (e.g., first clamp voltage path) which includes the Zener diode ZD (e.g., operating in the breakdown region) and transistor Q2, thereby providing a first voltage (e.g., a fixed voltage of 5.5V) at node N1.

In some embodiments, during the ESD mode of the semiconductor device 30, the I/O pads 31 and 32 may be floating. If an ESD event with a very high voltage $V_{ESD}$ occurs on the I/O pad 31, the voltage $V_{ESD}$ may be transferred to node N1 through the coupling path 37, causing the gate voltage of the LDMOS transistor Q1 at node N1 to exceed 5.5V. At this time, the Zener diode ZD would also enter the breakdown region, allowing a large current to pass through while maintaining its gate voltage at the breakdown voltage of the Zener diode ZD (e.g., 5.5V). Thus, the large current will flow from node N1 to the ground (e.g., power rail 34) along a current discharge path 35 (e.g., first clamp voltage path) which includes the Zener diode ZD (e.g., operating in the breakdown region) and transistor Q2, thereby providing a first voltage (e.g., a fixed voltage of 5.5V) at node N1.

Moreover, during the reliability acceleration test of the semiconductor device 30, the LDMOS transistor Q1 may operate with a gate voltage of approximately 7.5V at node N1. In this scenario, the boost diode BD may function in a similar manner as the Zener diode ZD, with the difference being that the boost diode BD may have a lower breakdown voltage (e.g., 2V) compared to the Zener diode ZD. Since the Zener diode ZD is reversed biased by a high voltage of approximately 7.5V at node N1, the Zener diode ZD would enter the breakdown region. Similarly, the boost diode BD is also reverse biased by a high voltage (e.g., 7.5V minus the breakdown voltage of the Zener diode ZD) at node N2, causing the boost diode BD to enter the breakdown region. Therefore, a large current flows from node N1 to the ground (e.g., power rail 34) along a current discharge path 36 (e.g., second clamp voltage path), which includes the Zener diode ZD (e.g., operating in the breakdown region) and boost diode BD (e.g., also operating in the breakdown region). The paths 35 and 36 (for example, discharge paths) can be regarded as a first clamp voltage path and a second clamp voltage path, respectively. In addition, the first clamp voltage path and the second clamp voltage path can be collectively regarded as a bias clamp circuit. In some embodiments, the breakdown voltage of the boost diode BD can be adjusted through a process control scheme, such as calibrating the concentration of specific impurities (i.e., dopant concentration) within the diode junction of the boost diode BD.

It is worth noting that the breakdown voltages of the Zener diode ZD and the boost diode BD may be designed to facilitate a design-technology co-optimization (DTCO) methodology, which involves a collaborative effort among process development engineering and circuit/IP design teams.

One way that circuit/IP designers and (manufacturing) process engineers can cooperate is that the circuit/IP designers simply dictate the circuit schematics and the specification of the circuit elements used in the schematics, and command the process engineers fabricate the circuits according to the specification imposed by the circuit/IP designers.

However, as semiconductor manufacturing technology advances, process engineering acquires ever more expertise and may become ever more costly and time-consuming. For example, in a certain process technology node (such as 14 nm, 12 nm, 10 nm, 8 nm, 6 nm, 5 nm, 4 nm, 3 nm, 2 nm, 1.8 nm etc.), the number of circuit elements available in the library provided by the manufacturing companies with proven performance and stable calibration may be limited. In other words, in certain process technology nodes, the circuit designers may not be able to select, say, a Zener diode with any breakdown voltages that they want; the library provided by the semiconductor foundry may only include Zener diodes having, say 5 different breakdown voltages for the circuit designers to choose from. In that event, when the circuit designers propose a circuit functional diagram and/or schematics, the foundry may propose another schematics that have the same or similar circuit-level specification and functions using element available in the foundry's library.

In other words, DTCO may be pursued because of the limited variety of Zener diodes and boost diodes with varying breakdown voltages in the cell library of certain (say, CMOS) manufacturing processes. Furthermore, the gate of the LDMOS transistor Q1 will be maintained at a high voltage (e.g., approximately 7.5V) during the reliability acceleration test of the semiconductor device 30. If a single Zener diode is used to limit the high voltage of 7.5V at node N1, it would be challenging for the process team to develop a new Zener diode with a breakdown voltage of 7.5V by calibrating the dopant concentration of this new Zener diode in the CMOS manufacturing process simply because the circuit designers want 7.5V. Additionally, a higher breakdown voltage of the Zener diode weakens the gate oxide protection of the LDMOS transistor Q1 from ESD events and abnormal operations (e.g., operating at a very high voltage or a very low voltage).

The design of switchable clamp voltage paths shown in FIG. 3 allows the LDMOS transistor Q1 to operate at a gate voltage of 5.5V during the normal DC operation mode of the semiconductor device 30, and at a high gate voltage of approximately 7.5V during the reliability acceleration test of the semiconductor device 30, possibly using only circuit elements in the library of well calibrated, process-proven circuit elements provided by the foundry. This could eliminate the need for the foundry to develop a new Zener diode with a different breakdown voltage (say, 7.5V), which could compromise the reliability of the gate oxide protection of the LDMOS transistor Q1. Furthermore, the adjustable clamp voltage level of the gate voltage of the I/O power device (e.g., LDMOS transistor Q1) allows the semiconductor device 30 to achieve effective gate oxide protection with a lower clamp bias voltage, while also enabling fast reliability acceleration with a higher clamp bias voltage.

Figure 4:
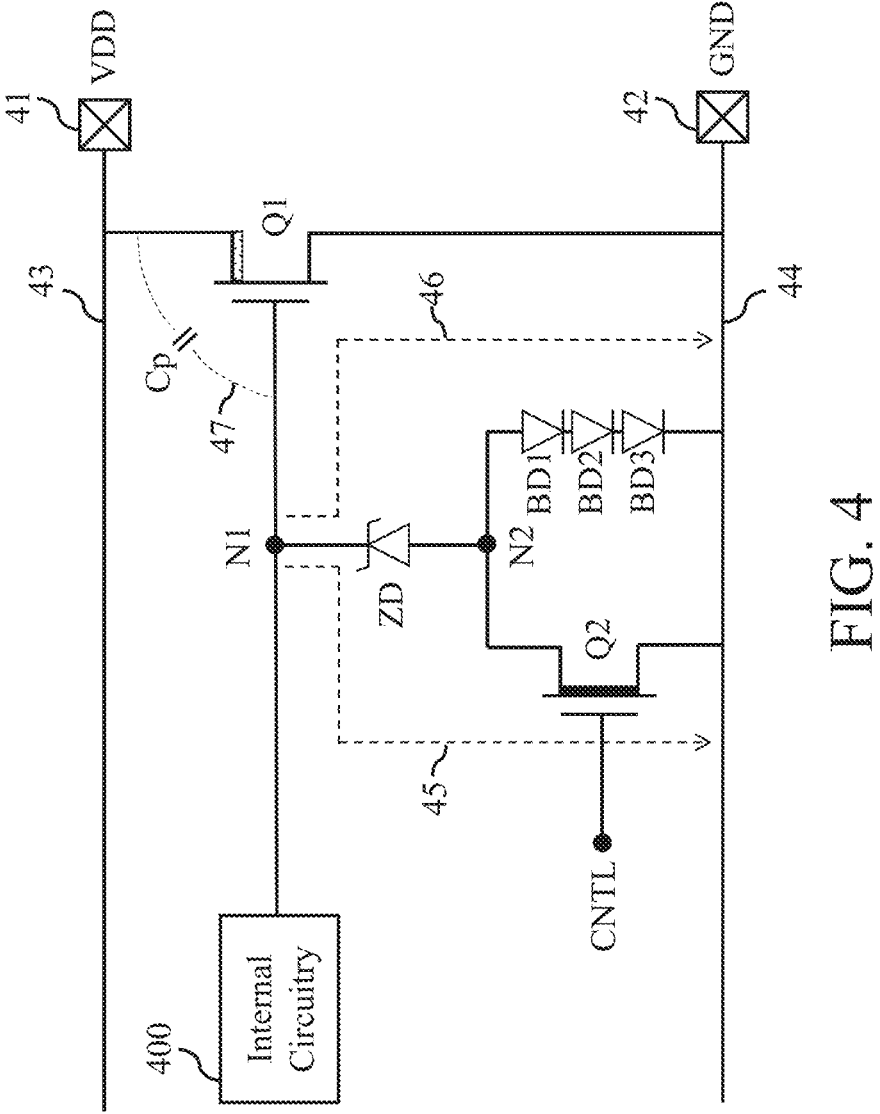
FIG. 4 is a schematic diagram of a semiconductor device in accordance with an embodiment of the present disclosure.

FIG. 4 is a schematic diagram of a semiconductor device in accordance with an embodiment of the present disclosure. Please refer to FIG. 1 and FIG. 4.

The semiconductor device 10 shown in FIG. 1 may be implemented using the semiconductor device 40 shown in FIG. 4. In some embodiments, as depicted in FIG. 4, the vulnerable circuit 110 shown in FIG. 1 may be implemented using an LDMOS transistor Q1, and the voltage clamp 120 may be implemented using a Zener diode ZD. In addition, the switch 130 may be implemented using transistor Q2 which is a depletion N-type transistor, and the voltage booster 140 may be implemented using forward-biased boost diodes BD1 to BD3 that are serially connected. The boost diodes BD1 to BD3 may have substantially the same forward-biased threshold voltage of approximately 0.7V.

Similar to the embodiment of FIG. 3, since transistor Q2 is a depletion N-type transistor with a negative threshold voltage, the control signal CNTL may be the ground voltage (e.g., 0V) during the normal DC operation mode of the semiconductor device 40 or floating during an ESD mode of the semiconductor device 40, causing transistor Q2 to turn on. Additionally, during the reliability acceleration test of the semiconductor device 40, the control signal CNTL may be a negative voltage lower than the threshold voltage of the transistor Q2 (e.g., a depletion N-type transistor) to turn off transistor Q2.

In some embodiments, during the normal DC operation mode of the semiconductor device 40, the coupling path 47 can be neglected (e.g., open circuited), and the LDMOS transistor Q1 may be designed to operate at a power supply voltage of 5V, with the gate voltage at node N1 not expected to exceed 5.5V in order to protect the gate oxide of the LDMOS transistor Q1. In this scenario, a Zener diode ZD with a breakdown voltage of 5.5V can be employed. If the gate voltage at node N1 eventually exceeds the breakdown voltage of the Zener diode ZD during the normal DC operation mode, the Zener diode ZD would enter the breakdown region, allowing a large current to pass through while maintaining its gate voltage at the breakdown voltage of the Zener diode ZD (e.g., 5.5V). Thus, the large current will flow from node N1 to the ground (e.g., power rail 44) along path 45 (e.g., first discharge path or first clamp voltage path) which includes the Zener diode ZD (e.g., operating in the breakdown region) and transistor Q2, thereby providing a first voltage (e.g., a fixed voltage of 5.5V) at node N1.

In some embodiments, during the ESD mode of the semiconductor device 40, the I/O pads 41 and 42 are floating. If an ESD event with a very high ESD voltage $V_{ESD}$ occurs on the I/O pad 41, the ESD voltage $V_{ESD}$ may be transferred to node N1 through the coupling path 47, causing the gate voltage of the LDMOS transistor Q1 at node N1 to exceed 5.5V. At this time, the Zener diode ZD would also enter the breakdown region, allowing a large current to pass through while maintaining its gate voltage at the breakdown voltage of the Zener diode ZD (e.g., 5.5V). Thus, the large current will flow from node N1 to the ground (e.g., power rail 44) along path 45 (e.g., first discharge path or first clamp voltage path) which includes the Zener diode ZD (e.g., operating in the breakdown region) and transistor Q2, thereby providing a first voltage (e.g., a fixed voltage of 5.5V) at node N1.

Moreover, during the reliability acceleration test of the semiconductor device 40, the control signal CNTL may be a negative voltage lower than the threshold voltage of the transistor Q2 (e.g., a depletion N-type transistor) to turn off transistor Q2, and the LDMOS transistor Q1 may operate with a gate voltage of approximately 7.6V at node N1, as depicted in FIG. 4. In this scenario, the boost diodes BD1 to BD3 are forward biased, with a threshold voltage of approximately 0.7V, resulting in an overall voltage drop of approximately 2.1V across the diode chain. Since the Zener diode ZD is reversed biased by a high voltage of approximately 7.6V at node N1, the Zener diode ZD would enter the breakdown region. Additionally, the boost diodes BD1 to BD3 are forward biased at node N2 (e.g., 7.6V minus the breakdown voltage of the Zener diode ZD), causing the boost diodes BD1 to BD3 to enter the forward-bias region. Therefore, a large current flows from node N1 to the ground (e.g., power rail 44) along path 46 (e.g., second discharge path or second clamp voltage path), which includes the Zener diode ZD (e.g., operating in the breakdown region) and boost diodes BD1 to BD3 (e.g., operating in the forward-bias region). The paths 45 and 46 can be regarded as a first clamp voltage path and a second clamp voltage path, respectively. In addition, the first clamp voltage path and the second clamp voltage path can be collectively regarded as a bias clamp circuit.

It is worth noting that the boost diodes BD1 to BD3 with a forward-bias threshold voltage of approximately 0.7V can be selected from the existing devices in the cell library of calibrated, stable manufacturing process, eliminating the need for tailor-made process parameters to create boost diodes of arbitrary threshold voltages. Additionally, the boost diodes BD1 to BD3 used in forward biasing shown in FIG. 4 may be different from the boost diode BD used in reverse biasing shown in FIG. 3. In some embodiments, each of the boost diodes BD1 to BD3 can be implemented using readily available transistor(s) in a diode-connected configuration, which indicates that the drain and gate of the transistor are connected to function as a diode. In some embodiments, the threshold voltages of the boost diodes BD1 to BD3 may be different. Alternatively, the threshold voltages of the boost diodes BD1 to BD3 may be substantially equal.

Figure 5:
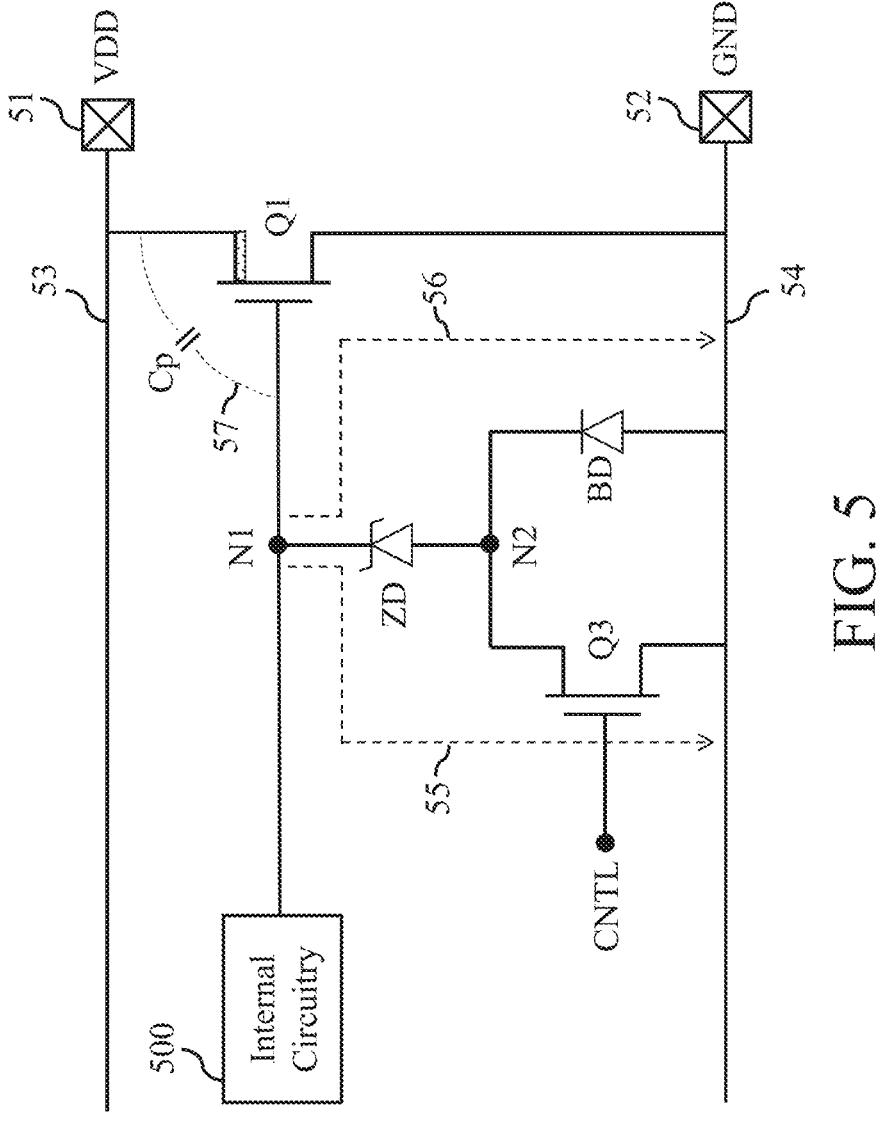
FIG. 5 is a schematic diagram of a semiconductor device in accordance with yet another embodiment of the present disclosure.

FIG. 5 is a schematic diagram of a semiconductor device in accordance with yet another embodiment of the present disclosure. Please refer to FIG. 1 and FIG. 5.

The semiconductor device 10 shown in FIG. 1 may be implemented using the semiconductor device 50 shown in FIG. 5. In some embodiments, as depicted in FIG. 5, the vulnerable circuit 110 shown in FIG. 1 may be implemented using an LDMOS transistor Q1, and the voltage clamp 120 may be implemented using a Zener diode ZD. In addition, the switch 130 may be implemented using transistor Q3 which is an enhancement N-type transistor, and the voltage booster 140 may be implemented using a reverse-biased boost diode BD with an anode connected to power rail 54 and a cathode connected to node N2.

The semiconductor device 50 shown in FIG. 5 may be similar to the semiconductor device 30 shown in FIG. 3, with the difference being that the switch 130 is implemented by an enhancement N-type transistor Q3 shown in FIG. 5. In some embodiments, the enhancement N-type transistor Q3 shown in FIG. 5 may have a positive threshold voltage, which differs from the depletion N-type transistor Q2 shown in FIGS. 3 and 4. As a result, the control signal CNTL may be a positive voltage higher than the threshold voltage of transistor Q3 during the normal DC operation mode or ESD mode of the semiconductor device 50, causing transistor Q3 to turn on. Additionally, during the reliability acceleration test of the semiconductor device 50, the control signal CNTL may be the ground voltage (e.g., 0V) to turn off transistor Q3. Details of the operations of the semiconductor device 50 can be referred to the embodiment of FIG. 3, and thus will not be repeated here.

Figure 6:
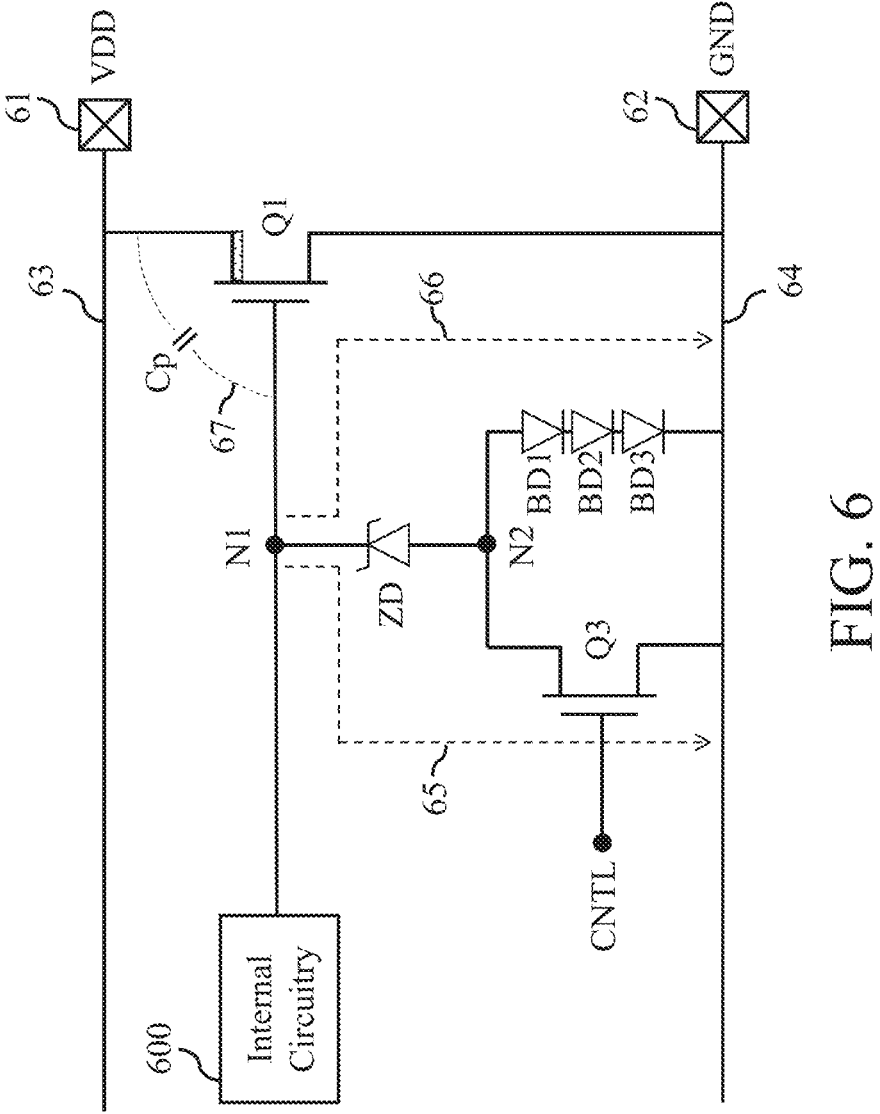
FIG. 6 is a schematic diagram of a semiconductor device in accordance with still another embodiment of the present disclosure.

FIG. 6 is a schematic diagram of a semiconductor device in accordance with still another embodiment of the present disclosure. Please refer to FIG. 1 and FIG. 6.

The semiconductor device 10 shown in FIG. 1 may be implemented using the semiconductor device 60 shown in FIG. 6. In some embodiments, as depicted in FIG. 6, the vulnerable circuit 110 shown in FIG. 1 may be implemented using an LDMOS transistor Q1, and the voltage clamp 120 may be implemented using a Zener diode ZD. In addition, the switch 130 may be implemented using transistor Q2 which is a enhancement N-type transistor, and the voltage booster 140 may be implemented using forward-biased boost diodes BD1 to BD3 that are serially connected. The boost diodes BD1 to BD3 may have substantially the same forward-biased threshold voltage of approximately 0.7V.

The semiconductor device 60 shown in FIG. 6 may be similar to the semiconductor device 40 shown in FIG. 4, with the difference being that the switch 130 is implemented by an enhancement N-type transistor Q3 shown in FIG. 6. In some embodiments, the enhancement N-type transistor Q3 shown in FIG. 6 may have a positive threshold voltage, which differs from the depletion N-type transistor Q2 shown in FIGS. 3 and 4. As a result, the control signal CNTL may be a positive voltage higher than the threshold voltage of transistor Q3 during the normal DC operation mode or ESD mode of the semiconductor device 60, causing transistor Q3 to turn on. Additionally, during the reliability acceleration test of the semiconductor device 60, the control signal CNTL may be the ground voltage (e.g., 0V) to turn off transistor Q3. Details of the operations of the semiconductor device 60 can be referred to the embodiment of FIG. 4, and thus will not be repeated here.

Figure 7:
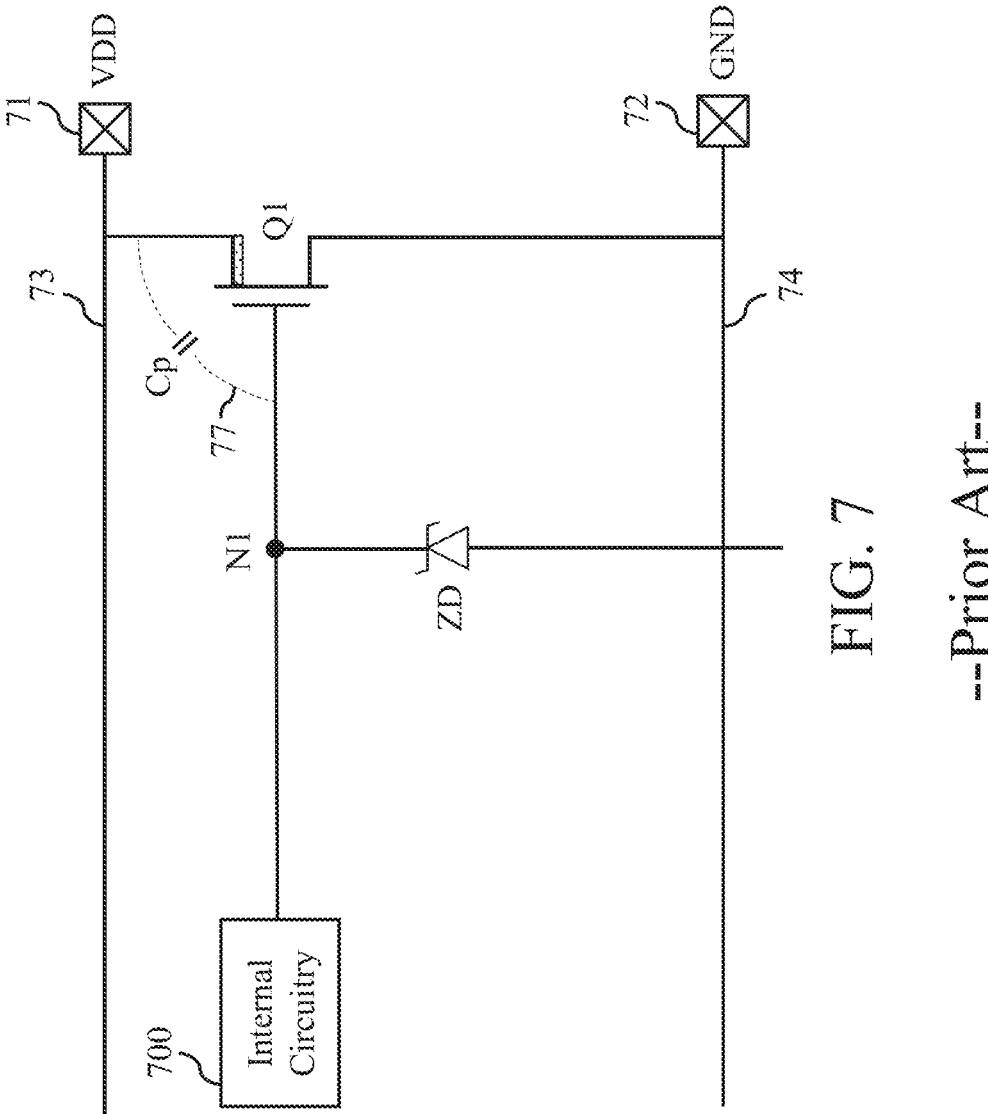
FIG. 7 is a schematic diagram of a semiconductor device in accordance with a comparative embodiment of the present disclosure.

FIG. 7 is a schematic diagram of a semiconductor device in accordance with a comparative embodiment of the present disclosure. Please refer to FIG. 1, FIG. 2, and FIG. 7.

In a comparative embodiment, the semiconductor device 10 shown in FIG. 1 may be implemented using the semiconductor device 70 shown in FIG. 7. As depicted in FIG. 7, the vulnerable circuit 110 shown in FIG. 1 may be implemented using an LDMOS transistor Q1, and the voltage clamp 120 may be implemented using a Zener diode ZD which is coupled between node N1 and power rail 74, where node N1 and power rail 74 are connected to the gate and drain of the LDMOS transistor Q1, respectively. It should be noted that the semiconductor device 70 does not include the switch 130 and voltage booster 140 shown in FIG. 1, resulting in the absence of switchable current paths in the semiconductor device 70 compared to the semiconductor devices described in the embodiments of FIGS. 3 to 6. In other words, the gate-source voltage (VGS) of the LDMOS transistor Q1 may be equal to the breakdown voltage of the Zener diode ZD during the normal DC operation mode or ESD mode of the semiconductor device 70.

However, when the Zener diode with a breakdown voltage of 5.5V is used during the reliability acceleration test of the semiconductor device 70, it is unlikely that the internal circuitry 700 can set the gate voltage of the LDMOS transistor Q1 to a voltage (e.g., approximately 7.5V) higher than the breakdown voltage of the Zener diode ZD, such as 5.5V. Consequently, conducting a reliability test with no acceleration would require a very long test time, making it impractical for the manufacturer to test these semiconductor devices before shipping.

Figure 8:
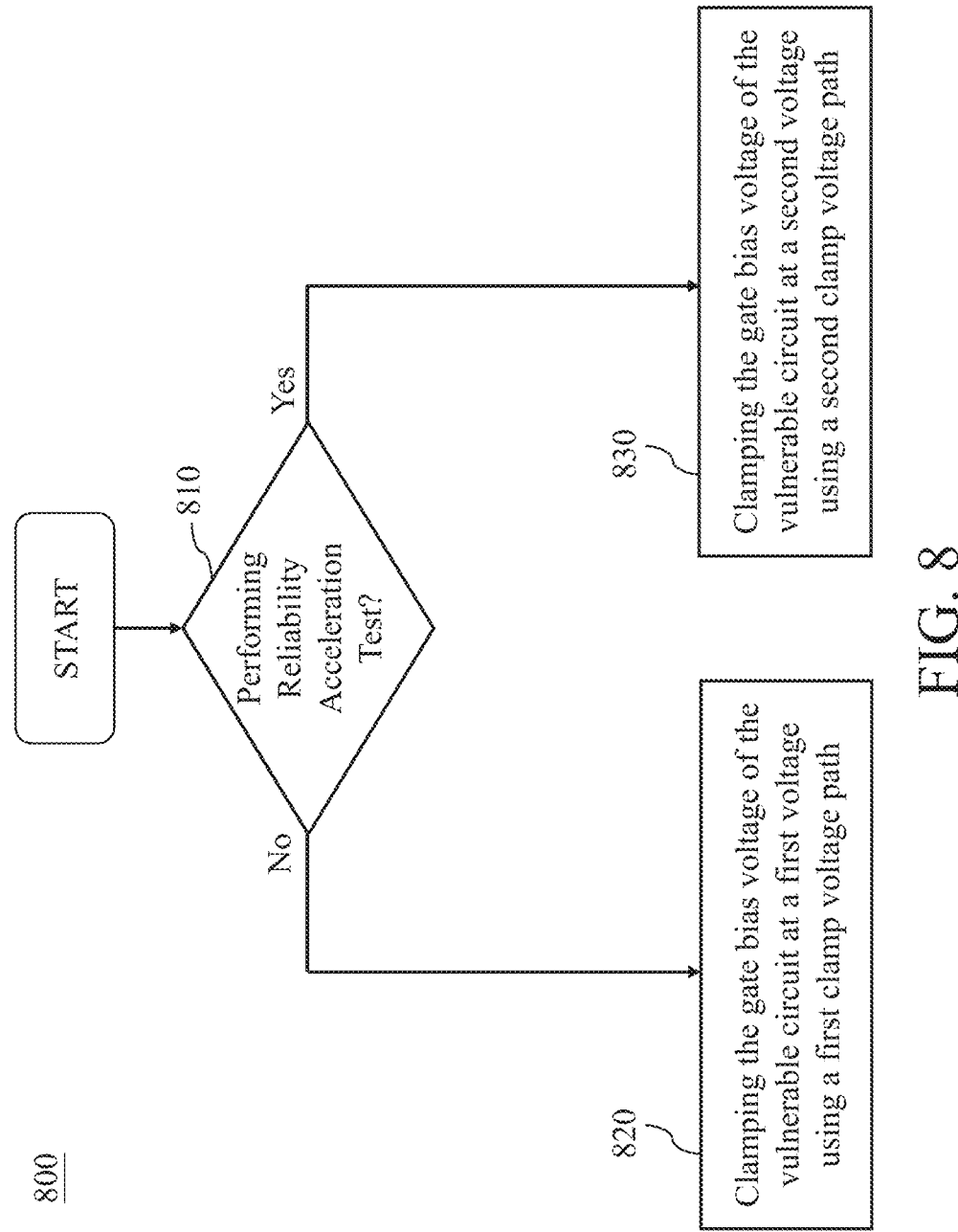
FIG. 8 is a flowchart of a method for adjusting a gate bias clamp voltage for use in a semiconductor device in accordance with an embodiment of the present disclosure.

FIG. 8 is a flowchart of a method for adjusting a gate bias clamp voltage for use in a semiconductor device in accordance with an embodiment of the present disclosure. Please refer to FIG. 1, FIG. 4, and FIG. 8.

At operation 810, it is determined whether a reliability acceleration test is performed on the semiconductor device 40. If it is determined that a reliability acceleration test is performed on the semiconductor device 40, operation 830 is performed. If it is determined that a reliability acceleration test is not performed on the semiconductor device 40, operation 820 is performed.

At operation 820, the gate bias voltage of the vulnerable circuit 110 is clamped at a first voltage using a first clamp voltage path. For example, the vulnerable circuit 110 may be implemented using LDMOS transistor Q1, as depicted in FIG. 4. The first clamp voltage path may include the Zener diode ZD and transistor Q2. Since the reliability acceleration test is not performed on the semiconductor device 40, the semiconductor device 40 may enter the normal DC operation mode, and internal circuitry 400 may provide a voltage of approximately 5.5V at the gate (e.g., node N1) of the LDMOS transistor Q1. In this case, the control signal CNTL may be the ground voltage (e.g., 0V) to turn on transistor Q2. Accordingly, the gate voltage of the LDMOS transistor Q1 is clamped to the breakdown voltage of the Zener diode ZD, such as 5.5V (e.g., the first voltage), and the reverse current may flow along the current discharge path 45 from node N1 to power rail 44 through the Zener diode ZD and transistor Q2.

At operation 830, the gate bias voltage of the vulnerable circuit is clamped at a second voltage using a second clamp voltage path. For example, the second clamp voltage path may include the Zener diode ZD and boost diodes BD1 to BD3. Since the reliability acceleration test is performed on the semiconductor device 40, the semiconductor device 40 may operate using a high power supply voltage VDD of approximately 7.6V, and the internal circuitry 400 may provide a high voltage of approximately 7.6V at the gate (e.g., node N1) of the LDMOS transistor Q1. In this case, the control signal CNTL may be a negative voltage lower than the threshold voltage of transistor Q2 to turn off transistor Q2. Accordingly, the Zener diode ZD may enter the breakdown region, and the boost diodes BD1 to BD3 may be forward biased, and therefore the gate voltage of the LDMOS transistor Q1 can be clamped at 7.6V (e.g., the second voltage) using the second clamp voltage path, where the breakdown voltage of the Zener diode is approximately 5.5V, and the overall voltage drop across the diode chain is 0.7*3=2.1V. The reverse current may flow along the current discharge path 46 from node N1 to power rail 44 through the Zener diode ZD and boost transistors BD1 to BD3.

An aspect of the present disclosure provides a semiconductor device, which includes a vulnerable circuit, a voltage clamp, a switch, and a voltage booster. The vulnerable circuit may be coupled to a first input/output (I/O) pad of the semiconductor device. The voltage clamp may be configured to provide a first voltage across a terminal of the vulnerable circuit and a first node. The switch may be coupled between the first node and a reference node. The voltage booster may be coupled between the first node and the reference node in parallel to the switch, and configured to provide a boost voltage. When a reliability acceleration test is not performed on the semiconductor device, a bias voltage at the terminal of the vulnerable circuit may be clamped at the first voltage via the voltage clamp and the switch. When the reliability acceleration test is performed on the semiconductor device, the bias voltage at the terminal of the vulnerable circuit may be clamped at a second voltage via the voltage clamp and the voltage booster, and the second voltage may be equal to the first voltage plus the boost voltage.

Another aspect of the present disclosure provides a bias clamp circuit, which includes a plurality of switchable clamp voltage paths, configured to selectively clamp a gate bias voltage of a vulnerable circuit to a first voltage or a second voltage based on whether a reliability acceleration test is performed on the vulnerable circuit or not. The second voltage may be higher than the first voltage.

Yet another aspect of the present disclosure provides a method for adjusting a gate bias clamp voltage, for use in a semiconductor device which includes a vulnerable circuit, a first clamp voltage path, and a second clamp voltage path. The method includes the following steps: determining whether a reliability acceleration test is performed on the semiconductor device; in response to determination that the reliability acceleration test is not performed on the semiconductor device, clamping a bias voltage of the vulnerable circuit at a first voltage using the first clamp voltage path; and in response to determination that the reliability acceleration test is performed on the semiconductor device, clamping the bias voltage of the vulnerable circuit at a second voltage using the second clamp voltage path, wherein the second voltage is higher than the first voltage.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
a vulnerable circuit, coupled to a first input/output (I/O) pad of the semiconductor device;
a voltage clamp, configured to provide a first voltage across a terminal of the vulnerable circuit and a first node;
a switch, coupled between the first node and a reference node; and
a voltage booster, coupled between the first node and the reference node in parallel to the switch, and configured to provide a boost voltage;

wherein when a reliability acceleration test is not performed on the semiconductor device, a bias voltage at the terminal of the vulnerable circuit is clamped at substantially the first voltage via the voltage clamp and the switch, wherein when the reliability acceleration test is performed on the semiconductor device, the bias voltage at the terminal of the vulnerable circuit is clamped at a second voltage via the voltage clamp and the voltage booster, and the second voltage is substantially equal to the first voltage plus the boost voltage.

2. The semiconductor device of claim 1, wherein the vulnerable circuit comprises an I/O power device.

3. The semiconductor device of claim 2, wherein the I/O power device comprises a laterally-diffused metal-oxide semiconductor (LDMOS) transistor.

4. The semiconductor device of claim 3, wherein a gate oxide of the LDMOS transistor is designed for operating at a first power supply voltage during a normal direct-current (DC) operation mode of the semiconductor device.

5. The semiconductor device of claim 4, further comprising:

internal circuitry, comprising a plurality of transistors for operating at a second power supply voltage during the normal DC operation mode of the semiconductor device, wherein the internal circuitry is configured to provide the bias voltage at the terminal of the vulnerable circuit during the normal DC operation mode of the semiconductor device, wherein the second power supply voltage is lower than the first power supply voltage.

6. A bias clamp circuit, comprising:

a plurality of switchable clamp voltage paths, configured to selectively clamp a bias voltage of a vulnerable circuit to a first voltage or a second voltage based on whether a reliability acceleration test is performed on the vulnerable circuit or not, wherein the second voltage is higher than the first voltage, wherein the switchable clamp voltage paths comprise:

a first path, configured to clamp the bias voltage of the vulnerable circuit to the first voltage when the reliability acceleration test is not performed on the vulnerable circuit; and a second path, configured to clamp the bias voltage of the vulnerable circuit to the second voltage when the reliability acceleration test is performed on the vulnerable circuit, wherein the first path and the second path share a voltage clamp that provides a substantially fixed clamp voltage.

7. The semiconductor device of claim 3, wherein the voltage clamp comprises a Zener diode with a breakdown voltage substantially equal to the first voltage.

8. The semiconductor device of claim 3, wherein in response to an electrostatic discharge (ESD) event occurring on the first I/O pad and coupling to the terminal of the LDMOS transistor through a coupling path between the terminal and a drain of the LDMOS transistor, and the voltage at the terminal is clamped at the first voltage via the voltage clamp and the switch.

9. The semiconductor device of claim 1, wherein the voltage booster comprises a plurality of boost diodes connected in series and in forward biasing, and the boost voltage substantially equals to a sum of a threshold voltage of each of the plurality of boost diodes.

10. The semiconductor device of claim 1, wherein the voltage booster comprises a boost diode in reverse biasing, and the boost voltage is substantially equal to a breakdown voltage of the boost diode.

11. The semiconductor device of claim 1, wherein the switch comprises a depletion N-type transistor controlled by a control signal.

12. The semiconductor device of claim 11, wherein the control signal is a ground voltage to turn on the depletion N-type transistor when the reliability acceleration test is not performed on the semiconductor device, and the control signal is a negative voltage to turn off the depletion N-type transistor when the reliability acceleration test is performed on the semiconductor device.

13. The semiconductor device of claim 1, wherein the switch comprises an enhancement N-type transistor controlled by a control signal.

14. The semiconductor device of claim 13, wherein the control signal is a positive voltage to turn on the enhancement N-type transistor when the reliability acceleration test is not performed on the semiconductor device, and the control signal is a ground voltage to turn off the enhancement N-type transistor when the reliability acceleration test is performed on the semiconductor device.

15. The bias clamp circuit of claim 6, wherein the first path further comprises a switch that is turned on when the reliability acceleration test is not performed on the vulnerable circuit, and turned off when the reliability acceleration test is performed on the vulnerable circuit, wherein the second path further comprises a voltage booster that is activated when the reliability acceleration test is performed on the vulnerable circuit, and is deactivated when the reliability acceleration test is not performed on the vulnerable circuit.

16. The bias clamp circuit of claim 6, wherein the vulnerable circuit comprises an I/O power device.

17. The bias clamp circuit of claim 16, wherein the I/O power device comprises a laterally-diffused metal-oxide semiconductor (LDMOS) transistor.

18. A method for adjusting a gate bias clamp voltage, for use in a semiconductor device comprising a vulnerable circuit, a first clamp voltage path, and a second clamp voltage path, the method comprising:

determining whether a reliability acceleration test is performed on the semiconductor device;

in response to a determination that the reliability acceleration test is not performed on the semiconductor device, clamping a bias voltage of the vulnerable circuit at a first voltage using the first clamp voltage path; and in response to a determination that the reliability acceleration test is performed on the semiconductor device, clamping the bias voltage of the vulnerable circuit at a second voltage using the second clamp voltage path, wherein the second voltage is higher than the first voltage, wherein the first clamp voltage path and the second clamp voltage path share a voltage clamp that provides a substantially fixed clamp voltage.

19. The method of claim 18, further comprising:

enabling the first clamp voltage path from a terminal of the vulnerable circuit to a ground through the voltage clamp and a switch during a normal direct-current (DC) operation mode of the semiconductor device; and enabling the second clamp voltage path from the terminal of the vulnerable circuit to the ground through the voltage clamp and a voltage booster in response to the determination that the reliability acceleration test is performed on the semiconductor device.

20. The method of claim 18, further comprising:

in response to an electrostatic discharge (ESD) event occurring at a first input/output (I/O) pad of the semiconductor device, enabling the first clamp voltage path from a terminal of the vulnerable circuit to a second I/O pad of the semiconductor device to clamp the gate bias voltage of the vulnerable circuit at the first voltage.

* * * * *